(12) United States Patent
Kim (10) Patent No.: US 8,050,449 B2
(45) Date of Patent: Nov. 1, 2011

(54) DISPLAY APPARATUS, FAN UNIT AND FAN SPEED CONTROL METHOD THEREOF

(75) Inventor: Young-chan Kim, Uiwang-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 927 days.

(21) Appl. No.: 11/942,003

(22) Filed: Nov. 19, 2007

(65) Prior Publication Data
US 2008/0165482 A1 Jul. 10, 2008

(30) Foreign Application Priority Data
Jan. 9, 2007 (KR) .................. 10-2007-0002624

(51) Int. Cl.
*G06K 9/00* (2006.01)
(52) U.S. Cl. .......................... 382/100; 353/57
(58) Field of Classification Search .................. 382/100; 345/10, 27; 353/52, 57; 361/679.46, 679.48
See application file for complete search history.

(56) References Cited

U.S. PATENT DOCUMENTS

| 7,131,731 B2* | 11/2006 | Oketani | 353/57 |
| 2002/0005916 A1 | 1/2002 | Sawai et al. | 348/748 |
| 2006/0197916 A1* | 9/2006 | Hashimoto | 353/52 |
| 2007/0045640 A1* | 3/2007 | Erchak et al. | 257/98 |

FOREIGN PATENT DOCUMENTS

| CN | 1828405 A | 9/2006 |
| EP | 0 923 237 A1 | 6/1999 |
| JP | 56-48770 A | 5/1981 |
| JP | 2002-358021 A | 12/2002 |
| JP | 2005-283645 A | 10/2005 |
| JP | 2005-309962 A | 11/2005 |
| KR | 10-2002-0075562 A | 10/2002 |
| KR | 10-2003-0017050 A | 3/2003 |
| KR | 10-2006-0071186 A | 6/2006 |

OTHER PUBLICATIONS

Machine translation of EP 0923237 A1, generated Mar. 14, 2011.*
Machine translation of JP 2005-309962 A, generated Mar. 14, 2011.*
Communication dated Jun. 22, 2011 issued by the State Intellectual Property Office of P.R. China in counterpart Chinese application No. 200710161115.9.

* cited by examiner

*Primary Examiner* — Andrew W Johns
(74) *Attorney, Agent, or Firm* — Sughrue Mion, PLLC (57) ABSTRACT

A display apparatus, a fan unit and a fan speed control method thereof are provided. The display apparatus includes an image processing unit that performs image processing for an image signal; a display unit that displays an image based on the image signal; a fan unit that comprises a fan for discharging heat generated in the display apparatus; and a controller that controls the fan unit to adjust a rotation speed of the fan based on an attribute of the image displayed on the display unit.

20 Claims, 7 Drawing Sheets

DISPLAY APPARATUS, FAN UNIT AND FAN SPEED CONTROL METHOD THEREOF

CROSS-REFERENCE TO RELATED APPLICATION

This application claims priority from Korean Patent Application No. 10-2007-0002624, filed on Jan. 9, 2007 in the Korean Intellectual Property Office, the disclosure of which is incorporated herein in its entirety by reference.

BACKGROUND OF INVENTION

Apparatuses and methods consistent with the present invention relate to a display apparatus, and more particularly, to a display apparatus that controls a fan speed depending on an image signal, a fan unit and a fan speed control method thereof.

A display apparatus outputs an image based on an image signal. The display apparatus needs a fan for discharging heat generated when current is supplied to the display apparatus and light is emitted from a backlight.

Figure 1A:
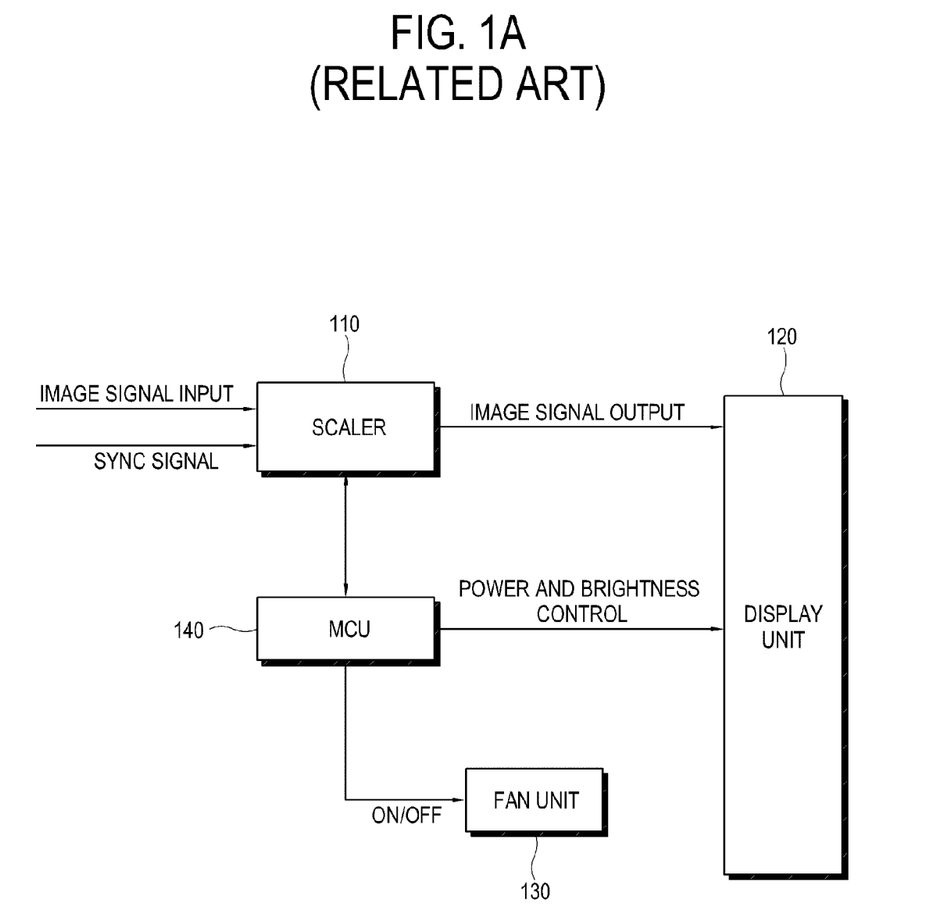
FIGS. 1A and 1B are block diagrams showing a configuration of a related art display apparatus.
Figure 1B:
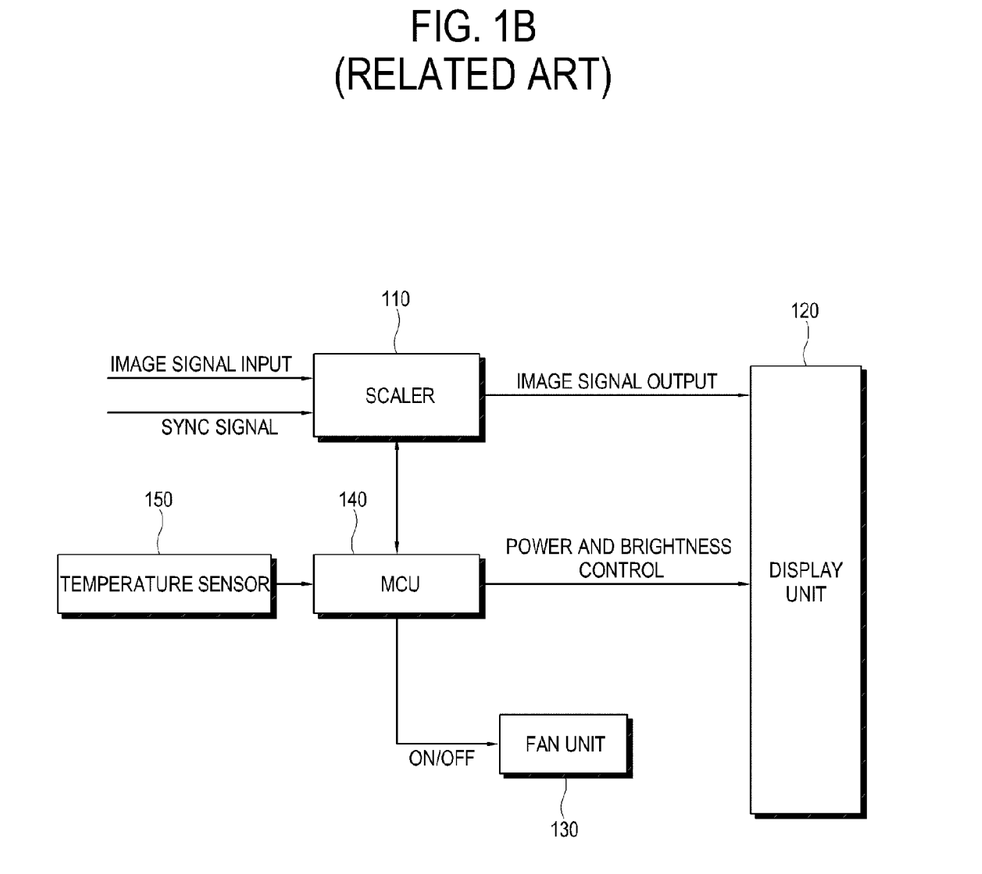

FIGS. 1A and 1B are block diagrams showing a configuration of a related art display apparatus.

Referring to FIG. 1A, a related art display apparatus includes a scaler 110, a display unit 120, a fan unit 130 and a Micro Controller Unit (MCU) 140 to turn on/off the fan unit depending on an operation condition of the display apparatus, for example, an image signal input to the scaler 110.

Referring to FIG. 1B, the related art display apparatus further comprises a temperature sensor 150 for detecting temperature of the display unit 120 to save power. If the temperature sensor 150 detects that the temperature set to the display apparatus exceeds a preset temperature, the MCU 140 turns on the fan unit 130. Otherwise, the MCU 140 turns off the fan unit 130.

However, if the related art display apparatus does not include the temperature sensor 150, since the fan of the fan unit 130 rotates at a constant speed at all times except when the display apparatus operates in a power saving mode, there arises a problem of wasteful power consumption and noises.

In addition, even when the display apparatus includes the temperature sensor 150, since the MCU 140 turns on/off the fan unit 130 depending on only the detected temperature, the MCU 140 cannot adjust the speed of the fan depending on an image displayed on the display unit 120.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a display apparatus which is capable of minimizing power consumption and noises by adjusting a speed of a fan based on attribute of an image displayed on a display unit, a fan unit and a fan speed control method thereof.

According to an aspect of the present invention, there is provided a display apparatus comprising: an image processing unit that performs image processing for an image signal; a display unit that displays an image based on the image signal; a fan unit that comprises a fan for discharging heat generated in the display apparatus; and a controller that controls the fan unit to adjust a rotation speed of the fan based on an attribute of the image displayed on the display unit.

The attribute of the image may comprise at least one of a luminance difference between adjacent pixels included in the image, a resolution at which the image is displayed and a brightness of the image.

The controller may control the fan unit to turn off the fan, if the at least one of the luminance difference, the resolution and the brightness is less than a preset value.

The display apparatus may further comprise a storing unit, and the controller may store the attribute of the image in the storing unit at predetermined intervals and controls the fan unit to adjust the rotation speed of the fan based on the attribute of the image stored in the storing unit.

The fan unit may further comprise a fan driving unit that drives the fan.

The display unit may comprise a liquid crystal display panel and a backlight unit including a plurality of light emitting diodes as a light source.

According to another aspect of the present invention, there is provided a fan unit comprising: a receiving unit that receives information on an image displayed on a display unit; a fan that discharges heat; a fan driving unit that drives the fan; and a fan controller that controls the fan driving unit to adjust a rotation speed of the fan based on an attribute of the image included in the information received from the receiving unit.

The attribute of the image may comprise at least one of a luminance difference between adjacent pixels included in the image, a resolution at which the image is displayed and a brightness of the image.

The fan controller may control the fan driving unit to turn off the fan, if the at least one of the luminance difference, the resolution and the brightness is less than a preset value.

The display unit may comprise a liquid crystal display panel and a backlight unit including a plurality of light emitting diodes as a light source.

According to another aspect of the present invention, there is provided a fan speed control method of a display apparatus comprising a display unit and a fan, the method comprising: receiving an image signal; determining an attribute of an image displayed on the display unit based on the image signal; and adjusting a rotation speed of the fan based on the attribute of the image.

The attribute of the image may comprise at least one of a luminance difference between adjacent pixels included in the image, a resolution at which the image is displayed and a brightness of the image.

The adjusting the rotation speed of the fan may comprise turning off the fan if the at least one of the luminance difference, the resolution and the brightness is less than a preset value.

The method may further comprise storing the attribute of the image at predetermined intervals, and the adjusting the rotation speed of the fan may comprise adjusting the rotation speed of the fan based on the stored attribute of the image.

The display unit may comprise a liquid crystal display panel and a backlight unit including a plurality of light emitting diodes as a light source.

According to another aspect of the present invention, there is provided a fan speed control method comprising: receiving information on an image displayed on a display unit; determining an attribute of the image based on the information; and adjusting a rotation speed of a fan based on the attribute of the image.

The attribute of the image may comprise at least one of a luminance difference between adjacent pixels included in the image, a resolution at which the image is displayed and a brightness of the image.

The adjusting the rotation speed of the fan may comprise turning off the fan if the at least one of the luminance difference, the resolution and the brightness is less than a preset value.

The method may further comprise storing the attribute of the image at predetermined intervals, and the adjusting the rotation speed of the fan may comprise adjusting the rotation speed of the fan based on the stored attribute of the image.

The display unit may comprise a liquid crystal display panel and a backlight unit including a plurality of light emitting diodes as a light source.

BRIEF DESCRIPTION OF THE DRAWINGS

The above and other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS OF THE INVENTION

Reference will now be made in detail to the embodiments of the present invention, examples of which are illustrated in the accompanying drawings, wherein like reference numerals refer to like elements throughout. The exemplary embodiments are described below so as to explain the present invention by referring to the drawings.

Figure 2A:
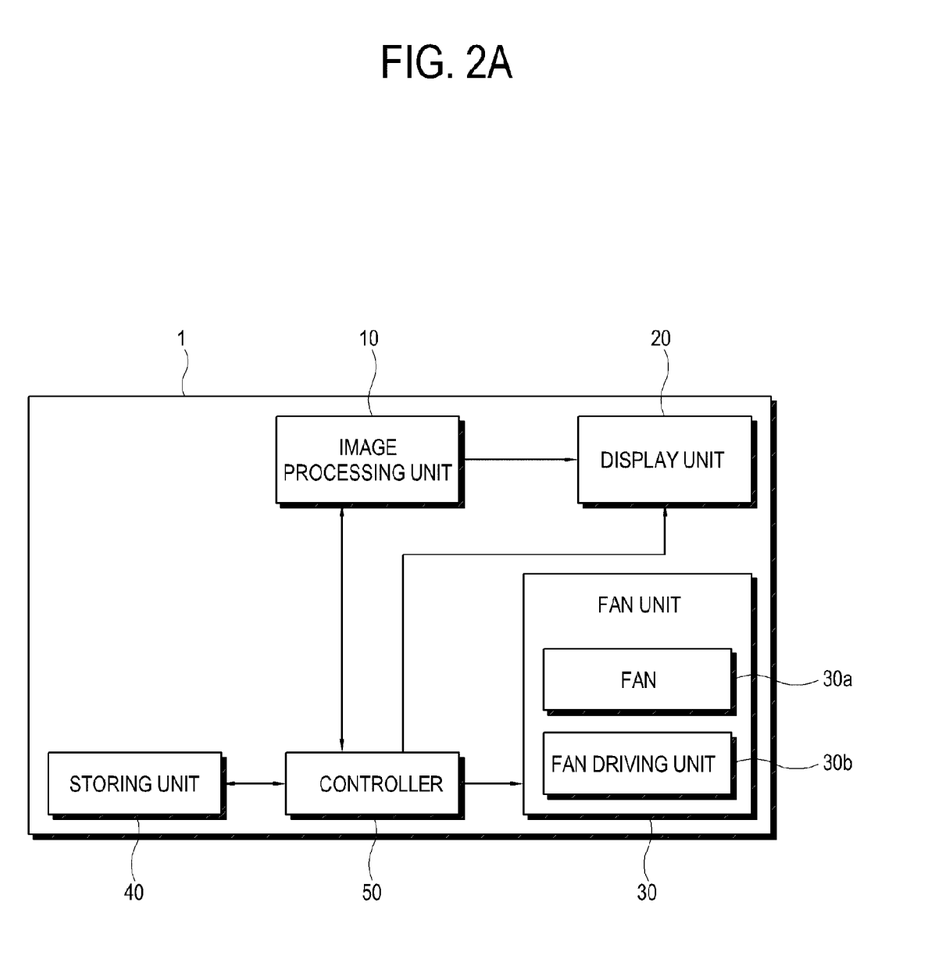
FIGS. 2A and 2B are block diagrams showing a configuration of a display apparatus according to an exemplary embodiment of the present invention.
Figure 2B:
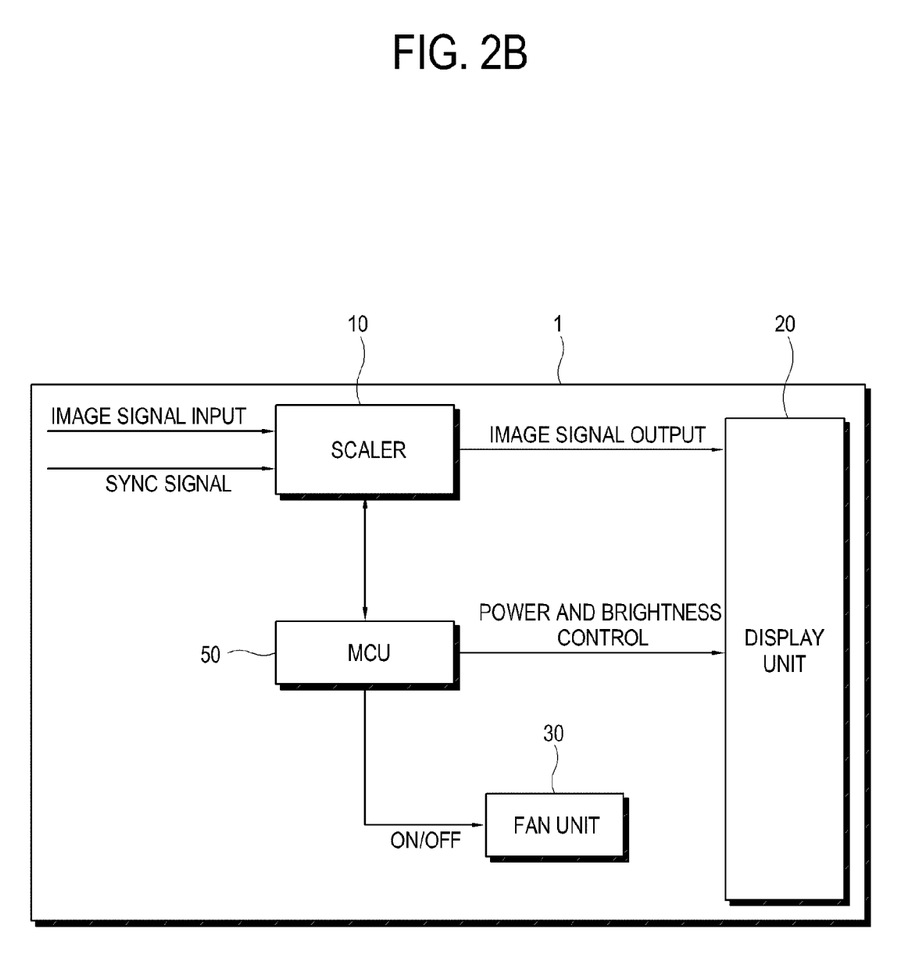

FIGS. 2A and 2B are block diagrams showing a configuration of a display apparatus according to an exemplary embodiment of the present invention.

Referring to FIG. 2A, the display apparatus 1 comprises an image processing unit 10, a display unit 20, a fan unit 30, a storing unit 40 and a controller 50. In this exemplary embodiment, the display apparatus 1 may be embodied by a television (TV), a monitor or other display apparatuses known in the art.

The image processing unit 10 performs an image processing for a received image signal. In addition, the image processing unit 10 may perform processing of decoding for extracting image information from the received image signal, scaling for adjusting resolution of the decoded image depending on characteristics of the display unit 20 and user's settings, and picture enhancement for enhancing image quality.

The display unit 20 displays an image based on the image signal processed by the image processing unit 10. In this exemplary embodiment, the display unit 20 may be embodied by a cathode ray tube (CRT), a liquid crystal display (LCD), a plasma display panel (PDP), a digital light processing display (DLP), a surface-conduction electron-emitter display (SED), a field emission display (FED) or other display devices known in the art. In the case where the display unit 20 is embodied as an LCD, the LCD may include LCD panel and a backlight unit including a plurality of light emitting diodes as a light source.

The fan unit 30 discharges heat generated in the display unit 20. The fan unit 30 may discharge heat generated from components for displaying the image on the display unit 20, such as the scaler included in the image processing unit 10, in addition to the display unit 20.

In this exemplary embodiment, the fan unit 30 further comprises a fan 30a and a fan driving unit 30b. The fan 30a moves air in one direction when the fan 30a rotates, and the fan driving unit 30b comprises a plurality of circuits for rotation of the fan 30a.

On the other hand, although not shown, the fan unit 30 may further comprise a noise measuring unit for measuring noises generated by the rotation of the fan 30a and a filter for filtering out alien substances contained in the air.

The storing unit 40 stores attributes of the image displayed on the display unit 20 and may be embodied by a flash memory or other memory devices known in the art. In this exemplary embodiment, in addition to the attributes of the image, the storing unit 40 may store values of rotation speed of the fan 30a corresponding to the attributes of the image.

The controller 50 controls the fan unit 30 to adjust the rotation speed of the fan 30a based on the attributes of the image displayed on the display unit 20. In this exemplary embodiment, the controller 50 may be embodied by an MCU, and may perform a function of adjusting brightness of the display unit 20 depending on the image signal.

Referring to FIG. 2B, if the controller 50 is embodied by the MCU and the image processing unit 10 is embodied by the scaler, the controller 50 may determine an attribute of the input image signal and control the rotation speed of the fan 30a as well as the tuning-on/off of the fan unit 30.

Hereinafter, an exemplary embodiment in which the controller 50 determines the attribute of the image displayed on the display unit 20 will be described.

First, the controller 50 may adjust the rotation speed of the fan 30a included in the fan unit 30 depending on a difference in luminance between adjacent pixels included in the image displayed on the display unit 20. The difference in luminance between the adjacent pixels means complexity according to a pattern of the image displayed on the display unit 20, and may be calculated by variations of the intensity of current supplied to the display unit 20 depending on the luminance of the adjacent pixels.

Based on the calculated luminance difference between the adjacent pixels, the controller 50 increases the rotation speed of the fan 30a if the calculated luminance difference is large, while decreasing the rotation speed of the fan 30a if the calculated luminance difference is small, thereby minimizing power consumption and noises occurring when the fan 30a rotates.

In this exemplary embodiment, the controller 50 may store a luminance difference between adjacent pixels included in a current frame of the image in the storing unit 40, compare the stored luminance difference with a luminance difference between adjacent pixels included in the next frame to be displayed on the display unit 20, and then adjust the rotation speed of the fan 30a based on a result of the comparison.

In addition, the controller 50 may adjust the rotation speed of the fan 30a depending on a frequency at which the image is displayed on the display unit 20. The controller 50 calculates a phase locked loop (PLL) clock according to resolution preset or input by a user. Then, the controller 50 increases the rotation speed of the fan 30a if the calculated PLL clock exceeds a reference value while decreasing the rotation speed of the fan 30a if the calculated PLL clock is less than the reference value. In this exemplary embodiment, the frequency at which the image is displayed may be varied depending on the resolution set by the user.

In addition, the controller 50 may adjust the rotation speed of the fan 30a depending on brightness of the image displayed on the display unit 20. In this exemplary embodiment, the image brightness means average brightness per frame of the image displayed on the display unit 20, and may be input through a user input unit (not shown). In addition, the controller 50 may store average brightness of a current frame of the image in the storing unit 40, compare the stored average brightness with average brightness of the next frame to be displayed on the display unit 20, and then adjust the rotation speed of the fan 30a based on a result of the comparison.

In addition, the controller 50 may analyze a histogram of the image signal and adjust the rotation speed of the fan 30a based on the analyzed histogram. The controller 50 divides the brightness of the image into a plurality of steps, for example, step 0 to step 255, which are grouped into 8 groups of steps, for example, a group of step 0 to step 31, a group of step 32 to step 63, etc., and calculates a brightness distribution of the image signal based on the 8 groups of steps. The controller 50 may control the fan unit 30 to increase the rotation speed of the fan 30a if it is determined, based on the calculated brightness distribution, that a current image frame is brighter than a previous image frame, while decreasing the rotation speed of the fan 30a if it is determined that the current image frame is darker than the previous image frame.

In addition, the controller 50 may store a calculated brightness distribution of a current image frame in the storing unit 40, compare the stored brightness distribution with a brightness distribution of the next image frame to be displayed on the display unit 20, and then adjust the rotation speed of the fan 30a based on a result of the comparison.

On the other hand, if the luminance difference between the adjacent pixels of the image displayed on the display unit 20, and at least one of the resolution and the image brightness are less than a preset value, the controller 50 may control the fan unit 30 to turn off the fan 30a, thereby minimizing power consumption.

Hereinafter, a fan unit according to another exemplary embodiment of the present invention will be described in detail with reference to FIG. 3.

Figure 3:
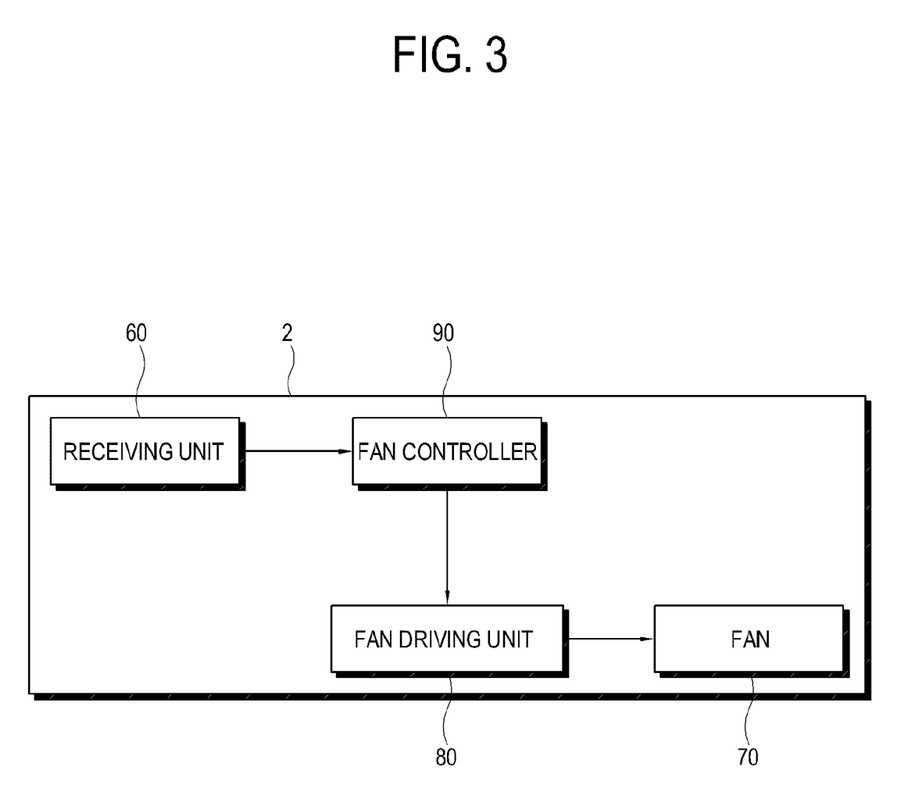
FIG. 3 is a block diagram showing a configuration of a fan unit according to another exemplary embodiment of the present invention.

Referring to FIG. 3, a fan unit 2 comprises a receiving unit 60, a fan 70, a fan driving unit 80 and a fan controller 90.

The receiving unit 60 receives information on an image from the outside, preferably from a display apparatus. In this exemplary embodiment, the information on the image may comprise attributes of the image, such as the luminance difference between the adjacent pixels of the image displayed on the display unit 20, the image resolution, the image brightness and the like.

The fan 70 moves air in one direction when the fan 70 rotates, and the fan driving unit 80 comprises a plurality of circuits for rotation of the fan 70.

The fan controller 90 controls the fan driving unit 80 to adjust the rotation speed of the fan 70 based on the image attributes included in the information received from the receiving unit 60, and may be embodied by a microcomputer and a software.

Similar to the controller 50 of the display apparatus 1 illustrated in FIGS. 2A and 2B, the fan controller 90 included in the fan unit 2 controls the fan driving unit 80 to adjust the rotation speed of the fan 70 based on the image attributes, such as the luminance difference between the adjacent pixels, the image resolution, the image brightness and the like.

Thus, power consumption and noises occurring when the fan 70 rotates can be minimized.

Figure 4:
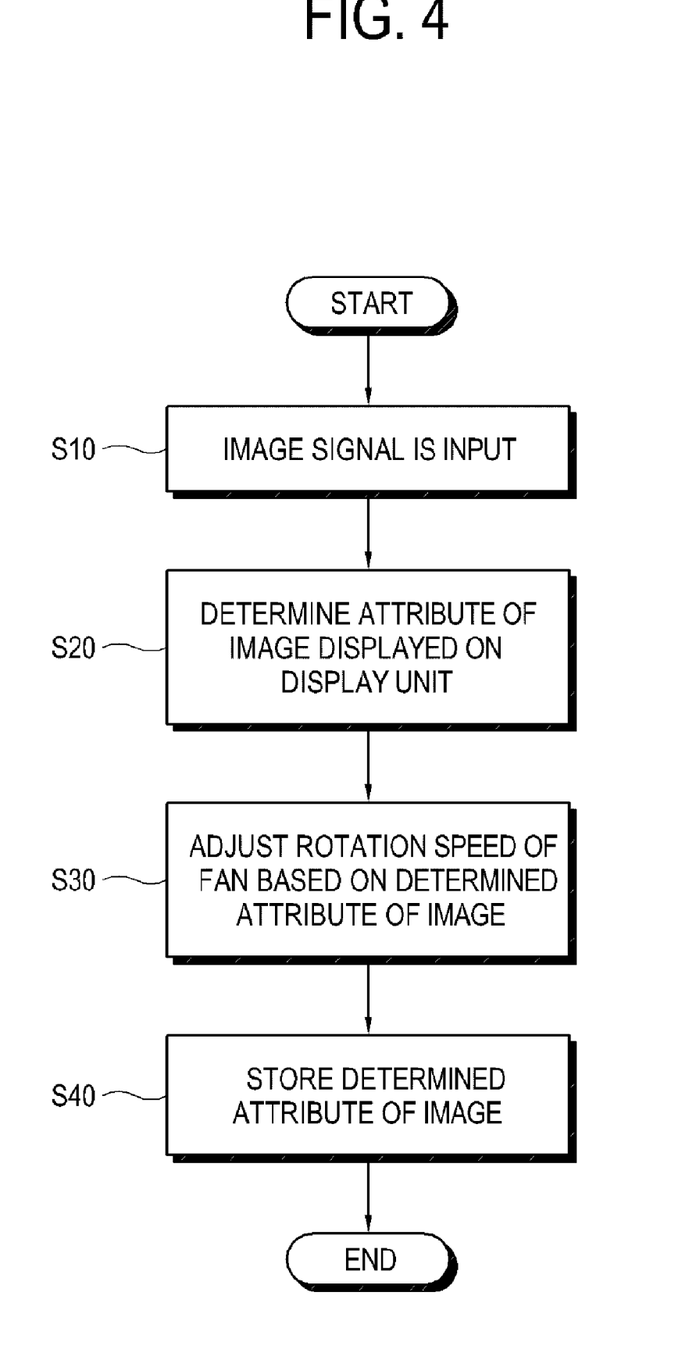
FIG. 4 is a flow chart illustrating a fan speed control method of a display apparatus according to an exemplary embodiment of the present invention.

Hereinafter, a fan speed control method of a display apparatus according to an exemplary embodiment of the present invention will be described with reference to FIG. 4.

First, the controller 50 is input an image signal (S10). Then, the controller 50 determines an attribute of an image displayed on the display unit 20 based on the input image signal (S20). Next, the controller 50 adjusts the rotation speed of the fan 30a based on the attribute of the image determined in the operation S20 (S30).

In this exemplary embodiment, the controller 50 may adjust the rotation speed of the fan 30a based on at least one of the luminance difference between the adjacent pixels of the image, the image resolution and the image brightness, and may control the fan 30a to be turned off if the attribute of the image has a value less than a preset value. Thus, power consumption and noises occurring when the fan 30a rotates can be minimized.

In addition, the controller 50 may further perform operation of storing the attribute of the image in the storing unit 40 (S40).

Figure 5:
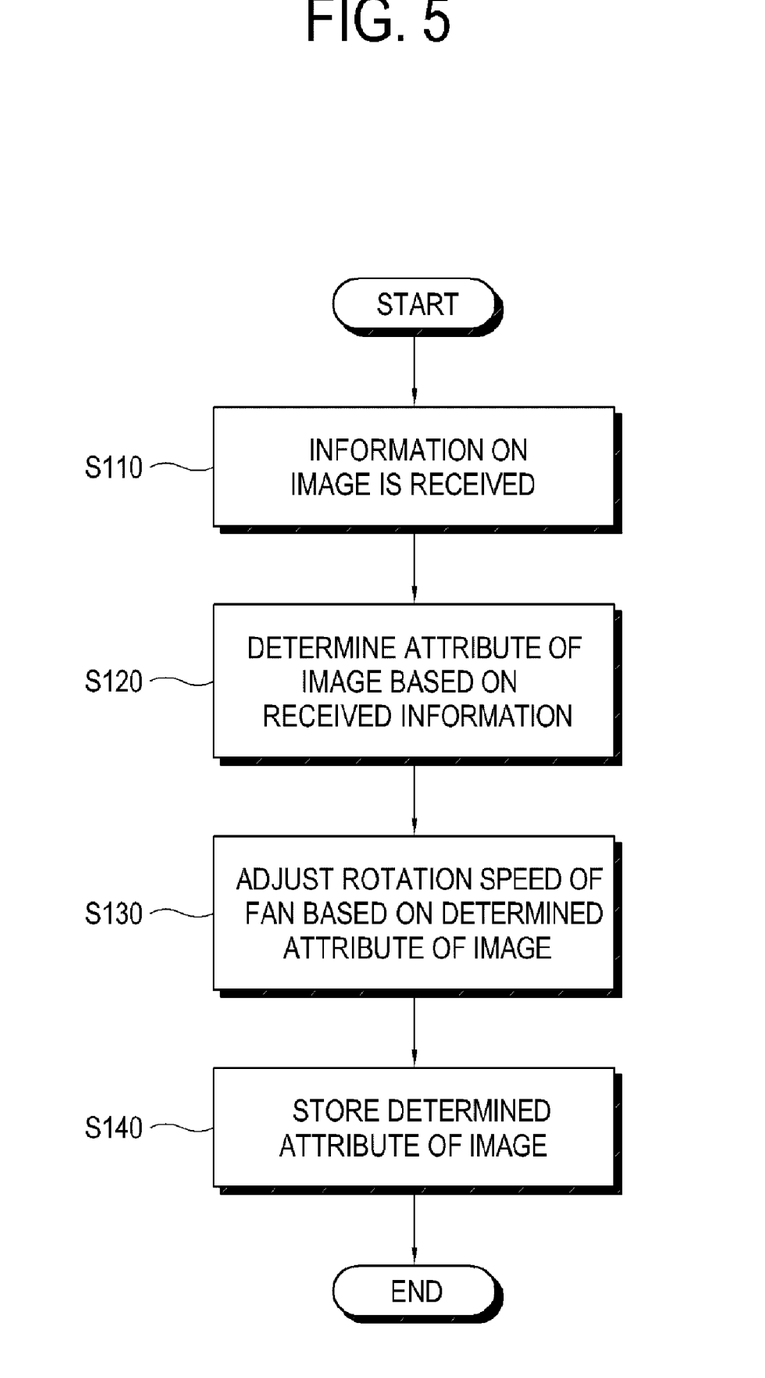
FIG. 5 is a flow chart illustrating a fan speed control method of a fan unit according to another exemplary embodiment of the present invention.

FIG. 5 illustrates a fan speed control method of a fan unit according to another exemplary embodiment of the present invention.

Referring to FIG. 5, first, the fan controller 90 receives information on an image (S110). Then, the fan controller 90 determines an attribute of the image based on the information received in the operation S110 (S120). Next, the fan controller 90 adjusts the rotation speed of the fan 70 based on the attribute of the image determined in the operation S120 (S130).

In addition, the fan controller may further perform operation of storing the determined attribute of the image in the storing unit 40 (S140).

As apparent from the above description, exemplary embodiments of the present invention provides a display apparatus, a fan unit and a fan speed control method thereof, which are capable of minimizing power consumption and noises by adjusting a rotation speed of a fan based on an attribute of an image displayed on a display unit.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display apparatus comprising:
   an image processing unit that performs image processing for an image signal;
   a display unit that displays an image based on the image signal;
   a fan unit that comprises a fan for discharging heat generated in the display apparatus; and
   a controller that determines an attribute of the image displayed on the display unit by determining at least one of a luminance difference between adjacent pixels included in the image and a resolution at which the image is displayed, and controls the fan unit to adjust a rotation speed of the fan based on the determined attribute of the image.

2. The display apparatus of claim 1, wherein the controller further determines a brightness of the image.

3. The display apparatus of claim 2, wherein the controller controls the fan unit to turn off the fan, if the at least one of the luminance difference, the resolution and the brightness is less than a preset value.

4. The display apparatus of claim 1, further comprising a storing unit,
wherein the controller stores the attribute of the image in the storing unit at predetermined intervals and controls the fan unit to adjust the rotation speed of the fan based on the attribute of the image stored in the storing unit.

5. The display apparatus of claim 1, wherein the fan unit further comprises a fan driving unit that drives the fan.

6. The display apparatus of claim 1, wherein the display unit comprises a liquid crystal display panel and a backlight unit including a plurality of light emitting diodes as a light source.

7. A fan unit comprising:
a receiving unit that receives information on an image displayed on a display unit, the information comprising at least one of a luminance difference between adjacent pixels included in the image and a resolution at which the image is displayed;
a fan that discharges heat;
a fan driving unit that drives the fan; and
a fan controller that controls the fan driving unit to adjust a rotation speed of the fan based on the at least one of the luminance difference and the resolution received by the receiving unit.

8. The fan unit of claim 7, wherein the information on the image further comprises a brightness of the image.

9. The fan unit of claim 8, wherein the fan controller controls the fan driving unit to turn off the fan, if the at least one of the luminance difference, the resolution and the brightness is less than a preset value.

10. The fan unit of claim 7, wherein the display unit comprises a liquid crystal display panel and a backlight unit including a plurality of light emitting diodes as a light source.

11. A fan speed control method of a display apparatus comprising a display unit and a fan, the method comprising:
receiving an image signal;
determining an attribute of an image displayed on the display unit based on the image signal, wherein the determining the attribute comprises determining at least one of a luminance difference between adjacent pixels included in the image and a resolution at which the image is displayed; and
adjusting a rotation speed of the fan based on the determined attribute of the image.

12. The fan speed control method of claim 11, wherein the determining the attribute further comprises determining a brightness of the image.

13. The fan speed control method of claim 12, wherein the adjusting the rotation speed of the fan comprises turning off the fan if the at least one of the luminance difference, the resolution and the brightness is less than a preset value.

14. The fan speed control method of claim 11, further comprising:
storing the attribute of the image at predetermined intervals,
wherein the adjusting the rotation speed of the fan comprises adjusting the rotation speed of the fan based on the stored attribute of the image.

15. The fan speed control method of claim 11, wherein the display unit comprises a liquid crystal display panel and a backlight unit including a plurality of light emitting diodes as a light source.

16. A fan speed control method comprising:
receiving information on an image displayed on a display unit;
determining an attribute of the image based on the information, wherein the determining the attribute comprises determining at least one of a luminance difference between adjacent pixels included in the image and a resolution at which the image is displayed; and
adjusting a rotation speed of a fan based on the attribute of the image.

17. The fan speed control method of claim 16, wherein the determining the attribute further comprises determining a brightness of the image.

18. The fan speed control method of claim 17, wherein the adjusting the rotation speed of the fan comprises turning off the fan if the at least one of the luminance difference, the resolution and the brightness is less than a preset value.

19. The fan speed control method of claim 16, further comprising storing the attribute of the image at predetermined intervals,
wherein the adjusting the rotation speed of the fan comprises adjusting the rotation speed of the fan based on the stored attribute of the image.

20. The fan speed control method of claim 16, wherein the display unit comprises a liquid crystal display panel and a backlight unit including a plurality of light emitting diodes as a light source.

* * * * *